(12) United States Patent
Tsuchiya et al.

(10) Patent No.: US 10,502,389 B2
(45) Date of Patent: Dec. 10, 2019

(54) VEHICLE LIGHTING DEVICE AND VEHICLE LAMP

(71) Applicant: Toshiba Lighting & Technology Corporation, Yokosuka-shi, Kanagawa-ken (JP)

(72) Inventors: Ryuji Tsuchiya, Yokosuka (JP); Masamitsu Nagano, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 0 days.

(21) Appl. No.: 16/105,564

(22) Filed: Aug. 20, 2018

(65) Prior Publication Data

US 2019/0093850 A1    Mar. 28, 2019

(30) Foreign Application Priority Data

Sep. 25, 2017    (JP) ................................. 2017-183967
Sep. 25, 2017    (JP) ................................. 2017-183979

(51) Int. Cl.
*F21S 45/10*    (2018.01)
*F21S 43/14*    (2018.01)
(Continued)

(52) U.S. Cl.
CPC ............... *F21S 45/10* (2018.01); *F21S 43/14* (2018.01); *F21S 45/48* (2018.01); *F21V 23/06* (2013.01); *F21V 25/10* (2013.01); *F21V 29/773* (2015.01); *H05K 1/0203* (2013.01); *H05K 1/181* (2013.01); *F21S 43/30* (2018.01); *F21Y 2115/10* (2016.08); *H05K 2201/066* (2013.01); *H05K 2201/10022* (2013.01); *H05K 2201/10106* (2013.01);
(Continued)

(58) Field of Classification Search
CPC ......... F21S 45/10; F21S 45/48; F21V 29/773; F21V 23/06; F21V 25/10
See application file for complete search history.

(56) References Cited

U.S. PATENT DOCUMENTS

2013/0314001 A1*    11/2013    Liu ................... H05B 33/0872
                                                        315/297
2018/0045380 A1    2/2018    Li et al.

FOREIGN PATENT DOCUMENTS

CN    106151905 A    11/2016
DE    202016100243 U1    2/2016
(Continued)

OTHER PUBLICATIONS

Feb. 4, 2019—(EP) Extended Search Report—App 18189301.7.
(Continued)

*Primary Examiner* — Anne M Hines
(74) *Attorney, Agent, or Firm* — Banner & Witcoff, Ltd.

(57) ABSTRACT

According to one embodiment, a vehicle lighting device includes a socket; and a light-emitting module provided on one end side of the socket. The light-emitting module includes a substrate having a wiring pattern; a plurality of light-emitting elements that are electrically connected to the wiring pattern and are connected in series to each other; and a plurality of thermistors that are electrically connected to the wiring pattern and are connected in parallel to each other. The plurality of thermistors connected in parallel to each other being connected in series with the plurality of light-emitting elements connected in series to each other.

20 Claims, 10 Drawing Sheets

(51) Int. Cl.
*F21V 29/77* (2015.01)
*F21S 45/48* (2018.01)
*F21V 23/06* (2006.01)
*F21V 25/10* (2006.01)
*H05K 1/02* (2006.01)
*H05K 1/18* (2006.01)
*F21Y 115/10* (2016.01)
*F21S 43/30* (2018.01)

(52) U.S. Cl.
CPC .............. *H05K 2201/10174* (2013.01); *H05K 2201/10196* (2013.01)

(56) References Cited

FOREIGN PATENT DOCUMENTS

| | | |
|---|---|---|
| EP | 3118059 A1 | 1/2017 |
| JP | 2000-278859 A | 10/2000 |

OTHER PUBLICATIONS

D.-W. Kang, et al, "Control of current distribution between parallel-connected NTC thermistors", Electronics Letters, vol. 53, No. 3, Feb. 2, 2017 (Feb. 2, 2017), pp. 169-171, XP055540818, GB ISSN: 0013-5194, DOI: 10.1049/el.2016.4122.

* cited by examiner

| LIGHT-EMITTING COLOR | RATED CURRENT | DRIVING CONDITION | THERMISTOR 27 | | | COMBINED RESISTANCE VALUE OF SECOND RESISTOR 28 | RESISTANCE VALUE OF FIRST RESISTOR 23 | TOTAL RESISTANCE VALUE | RESISTANCE RATIO OF THERMISTOR 27 | RESISTANCE RATIO OF FIRST RESISTOR 23 | THERMISTOR 27 (PER ONE) | |
|---|---|---|---|---|---|---|---|---|---|---|---|---|
| | | | RESISTANCE VALUE | NUMBER | COMBINED RESISTANCE VALUE | | | | | | CURRENT | POWER CONSUMPTION |
| WHITE | 350mA | CONTINUING | 4.7Ω | TWO (PARALLEL CONNECTION) | 2.35Ω | 7.75Ω | 1.8Ω | 11.9Ω | 19.6% | 15.1% | 175mA | 0.14W |
| UMBER | 450mA | FLICKERING | 4.7Ω | THREE (PARALLEL CONNECTION) | 1.57Ω | 5.98Ω | 1.1Ω | 8.65Ω | 18.5% | 12.7% | 150mA | 0.11W |

FIG. 8

| LIGHT-EMITTING COLOR | RATED CURRENT | DRIVING CONDITION | THERMISTOR 27 | | | COMBINED RESISTANCE VALUE OF SECOND RESISTOR 28 | RESISTANCE VALUE OF FIRST RESISTOR 23 | TOTAL RESISTANCE VALUE | RESISTANCE RATIO OF THERMISTOR 27 | RESISTANCE RATIO OF FIRST RESISTOR 23 | THERMISTOR 27 (PER ONE) | |
|---|---|---|---|---|---|---|---|---|---|---|---|---|
| | | | RESISTANCE VALUE | NUMBER | COMBINED RESISTANCE VALUE | | | | | | CURRENT | POWER CONSUMPTION |
| WHITE | 350mA | CONTINUING | 4.7Ω | TWO (PARALLEL CONNECTION) | 2.35Ω | 7.75Ω | 1.8Ω | 11.9Ω | 19.7% | 15.1% | 175mA | 0.14W |
| UMBER | 450mA | FLICKERING | 4.7Ω | THREE (PARALLEL CONNECTION) | 1.57Ω | 5.98Ω | 1.1Ω | 8.65Ω | 18.1% | 12.7% | 150mA | 0.11W |
| RED | 200mA | CONTINUING | 4.7Ω | ONE (SERIAL CONNECTION) | 4.7Ω | 16.68Ω | 3.3Ω | 21.38Ω | 22.0% | 15.4% | 200mA | 0.188W |

FIG. 12

VEHICLE LIGHTING DEVICE AND VEHICLE LAMP

CROSS-REFERENCE TO RELATED APPLICATIONS

This application is based upon and claims the benefit of priority from Japanese Patent Application No. 2017-183967, filed on Sep. 25, 2017; and Japanese Patent Application No. 2017-183979, filed on Sep. 25, 2017; the entire contents of which are incorporated herein by reference.

FIELD

Embodiments described herein relate generally to a vehicle lighting device and a vehicle lamp.

BACKGROUND

There is a vehicle lighting device including a socket and a light emitting module which is provided on one end side of the socket. The light-emitting module includes a substrate provided with a wiring pattern and a light-emitting diode (LED) electrically connected to the wiring pattern.

When a voltage is applied to the vehicle lighting device (light-emitting diode), the vehicle lighting device is turned on. When the voltage is applied to the light-emitting diode, a current flows through the light-emitting diode to generate heat, and a temperature of the light-emitting diode rises. In the case of the vehicle lighting device provided in automobiles, the voltage applied to the vehicle lighting device (light-emitting diode) fluctuates. Therefore, the temperature of the light-emitting diode becomes too high, and the light-emitting diode may be broken or the lifetime of the light-emitting diode may be shortened.

Therefore, a technique is proposed in which a resistor is connected in parallel with a circuit in which the resistor and a positive temperature coefficient thermistor are connected in series; and a current flows only in the resistor connected in parallel by shutting off the positive temperature coefficient thermistor in the case of an overvoltage.

However, in this case, the current flowing through the light-emitting diode abruptly changes when the thermistor shuts off, and thus the total light flux may suddenly fluctuate.

Accordingly, it is necessary to develop a technique in which a current can be prevented from flowing in the light-emitting element such as the light-emitting diode and sudden fluctuation of the total light flux can be prevented even when the voltage applied to the vehicle lighting device increases.

BRIEF DESCRIPTION OF THE DRAWINGS

FIG. 8 is a diagram illustrating an example of the first resistor, the thermistor, and the second resistor;

FIG. 12 is a diagram illustrating an example of the first resistor, the thermistor, and the second resistor.

DETAILED DESCRIPTION

Figure 1:
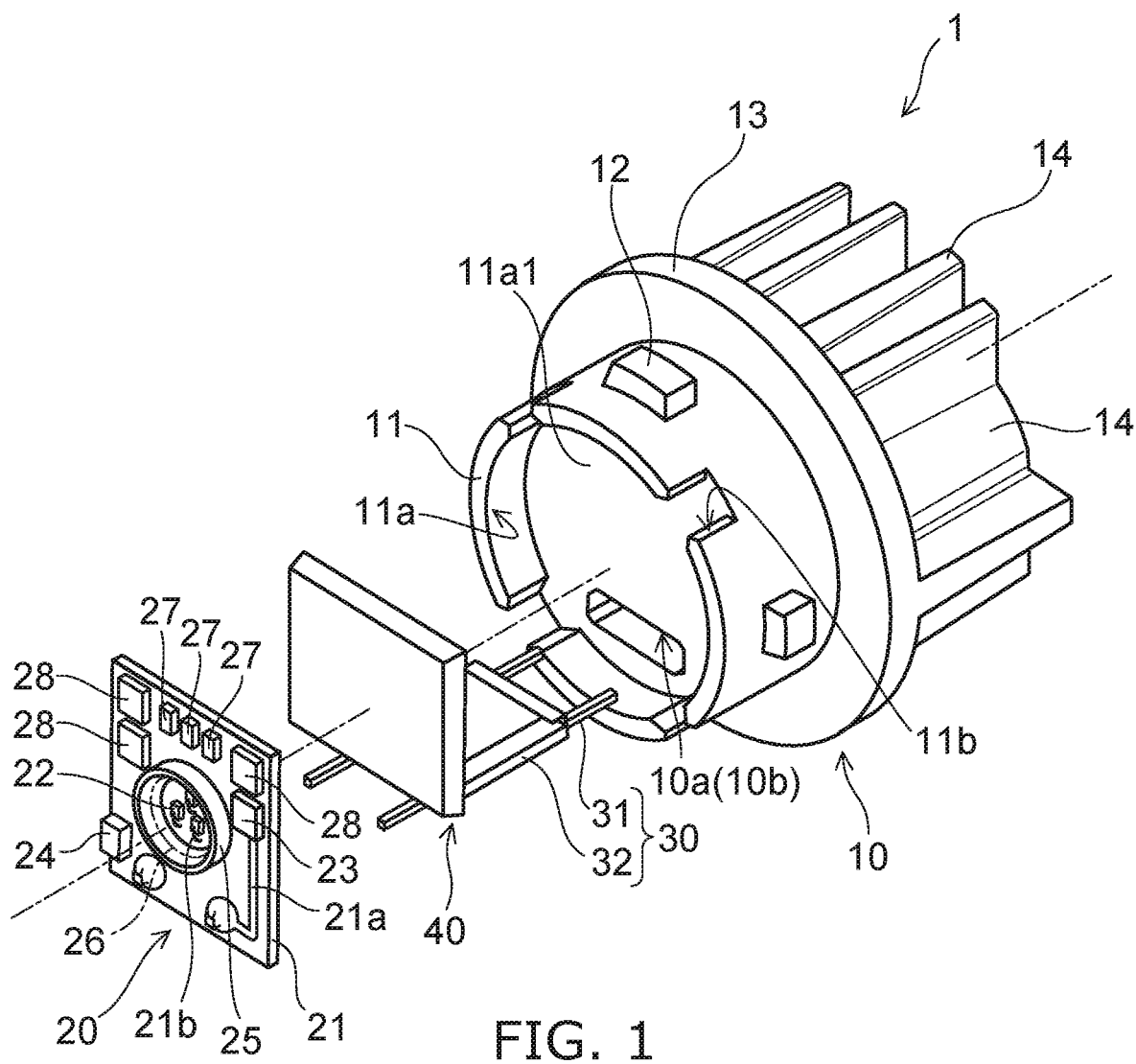
FIG. 1 is a schematic exploded view of a vehicle lighting device according to an embodiment.

In general, according to one embodiment, a vehicle lighting device includes a socket; and a light-emitting module provided on one end side of the socket. The light-emitting module includes a substrate having a wiring pattern; a plurality of light-emitting elements that are electrically connected to the wiring pattern and are connected in series to each other; and a plurality of thermistors that are electrically connected to the wiring pattern and are connected in parallel to each other. The plurality of thermistors connected in parallel to each other being connected in series with the plurality of light-emitting elements connected in series to each other.

Hereinafter, the embodiment will be exemplified with reference to drawings. In each of the drawings, the same constituent elements are denoted by the same reference numerals, and detailed descriptions thereof will be appropriately omitted.

Vehicle Lighting Device

A vehicle lighting device 1 according to the embodiment can be provided in a vehicle or a railway vehicle, for example. The vehicle lighting device 1 provided in the vehicle may include, for example, a device which is used in a front combination light (for example, light in which daytime running lamp (DRL), position lamp, turn signal lamp, and the like are appropriately combined), a rear combination light (for example, light in which stop lamp, tail lamp, turn signal lamp, back lamp, fog lamp, and the like are appropriately combined), or the like. However, a use of the vehicle lighting device 1 may be applied in addition to these uses.

FIG. 1 is a schematic exploded view of the vehicle lighting device 1 according to the embodiment.

Figure 2:
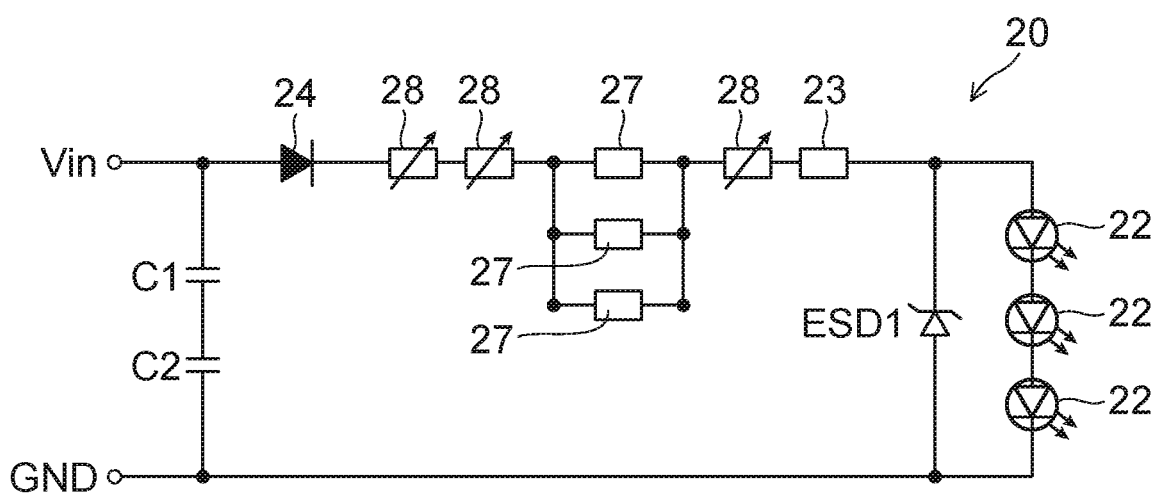
FIG. 2 is a circuit diagram of a light-emitting module.

FIG. 2 is a circuit diagram of a light-emitting module 20.

As illustrated in FIG. 1, the vehicle lighting device 1 is provided with a socket 10, a light-emitting module 20, a power feeding unit 30, and a heat transfer unit 40.

The socket 10 includes a mounting portion 11, a bayonet 12, a flange 13, and a thermal radiation fin 14.

The mounting portion 11 is provided on a face of the flange 13 on a side opposite to a side on which the thermal radiation fin 14 is provided. An external shape of the mounting portion 11 can be columnar. The external shape of the mounting portion 11 is, for example, a cylindrical shape. The mounting portion 11 includes a recessed portion 11a which is open to an end face on a side opposite to the side of the flange 13. The light-emitting module 20 is provided on a bottom 11a1 of the recessed portion 11a.

At least one slit 11b can be provided in the mounting portion 11. A corner portion of a substrate 21 is provided inside the slit 11b. A dimension (width dimension) of the slit lib in a circumferential direction of the mounting portion 11 is slightly larger than a dimension of the corner portion of the substrate 21. For this reason, when the corner portion of the substrate 21 is inserted into the inside of the slit lib, positioning of the substrate 21 is made.

In addition, when the slit lib is provided, a planar shape of the substrate 21 can be increased. Therefore, the number of elements to be mounted on the substrate 21 can be increased. Alternatively, since the external dimension of the mounting portion 11 can be reduced, the size of the mounting portion 11 can be reduced, and the size of the vehicle lighting device 1 can be eventually reduced.

The bayonet 12 is provided on an outer surface of the mounting portion 11. The bayonet 12 protrudes toward the outside of the vehicle lighting device 1. The bayonet 12 faces the flange 13. A plurality of the bayonets 12 are provided. The bayonet 12 is used when the vehicle lighting device 1 is attached to a housing 101 of a vehicle lamp 100. The bayonet 12 is used for twist-lock.

The flange 13 is formed in a plate shape. The flange 13 can be in the form of a disk, for example. An outer surface of the flange 13 is located in the outside of the vehicle lighting device 1 compared to an outer surface of the bayonet 12.

The thermal radiation fin 14 is provided on a side of the flange 13 opposite to the side on which the mounting portion 11 is provided. At least one thermal radiation fin 14 can be provided. A plurality of thermal radiation fins 14 are provided in the socket 10 illustrated in FIG. 1. The plurality of thermal radiation fins 14 can be provided side by side in a predetermined direction. The thermal radiation fins 14 may have a flat plate shape.

In addition, a hole 10a and a hole 10b are provided in the socket 10. One end of the hole 10a is open to the bottom 11a1 of the recessed portion 11a. An insulating portion 32 is provided inside the hole 10a. One end of the hole 10b is connected to the other end of the hole 10a. The other end of the hole 10b is open to the side of the thermal radiation fin 14 of the socket 10. A connector 105 including a sealing member 105a is inserted into the hole 10b. For this reason, a sectional shape of the hole 10b is adapted to a sectional shape of the connector 105 including the sealing member 105a.

Heat generated in the light-emitting module 20 is mainly transferred to the thermal radiation fin 14 through the mounting portion 11 and the flange 13. The heat transferred to the thermal radiation fin 14 is mainly radiated to the outside from the thermal radiation fin 14.

In this case, the socket 10 can efficiently radiate the heat generated in the light-emitting module 20, and is desirably lightweight.

For this reason, the socket 10 is preferably formed of a material with high heat conductivity in consideration of transferring the heat generated in the light-emitting module 20 to the outside. The material having high heat conductivity can be, for example, a metal such as aluminum or an aluminum alloy, a high heat conductivity resin, or the like. The high heat conductivity resin is obtained by mixing a filler using an inorganic material with a resin such as PET (Polyethylene terephthalate), PBT (polybutylene terephthalate), or nylon. The filler may contain, for example, ceramics such as aluminum oxide, carbon, and the like. If the socket 10 is formed using the high heat conductivity resin, the heat generated in the light-emitting module 20 can be efficiently radiated and the weight can be reduced.

The mounting portion 11, the bayonet 12, the flange 13, and the thermal radiation fin 14 can be integrally molded by die casting, injection molding, or the like. When these components are integrally molded, heat transfer becomes easy, and thus the thermal radiation property can be improved. In addition, it is easy to reduce manufacturing costs, to miniaturize the size, and to reduce the weight.

The light-emitting module 20 is provided on one end side of the socket 10.

The light-emitting module 20 includes the substrate 21, a light emitting element 22, a first resistor 23, a diode 24, a frame 25, a thermistor 27, and a second resistor 28.

The substrate 21 is provided in the heat transfer unit 40 through a bonding portion. That is, the substrate 21 is bonded to the surface of the heat transfer unit 40 on the side of the substrate 21. The substrate 21 has a flat plate shape. The flat plate shape of the substrate 21 may be a quadrangle, for example. A material or a structure of the substrate 21 is not particularly limited. For example, the substrate 21 can be formed of an inorganic material such as ceramic (for example, aluminum oxide, aluminum nitride, or the like), an organic material such as paper phenol, glass epoxy, or the like. In addition, the substrate 21 may be a substrate in which the surface of a metal plate is coated with an insulating material. When the surface of metal is coated with the insulating material, the insulating material may be formed of an organic material or an inorganic material. When the amount of heat generated by the light-emitting element 22 is large, it is preferable to form the substrate 21 using a material having high heat conductivity from the viewpoint of thermal radiation. The material with high heat conductivity may include, for example, ceramics such as aluminum oxide or aluminum nitride, a high heat conductivity resin, or a material obtained by coating the surface of a metal plate with an insulating material. In addition, the substrate 21 may be formed in a single layer, or a multiple layer.

A wiring pattern 21a is provided on the surface of the substrate 21. The wiring pattern 21a can be formed of a material containing copper as a main component. However, the material of the wiring pattern 21a is not limited to the material containing copper as a main component. The wiring pattern 21a can also be formed of, for example, a material containing silver as a main component. The wiring pattern 21a can be formed of silver, or a silver alloy, for example.

The light emitting element 22 is provided on a side of the substrate 21 opposite to the side of the bottom 11a1 of the recessed portion 11a. The light emitting element 22 is provided on the substrate 21. The light emitting element 22 is electrically connected to the wiring pattern 21a provided on the surface of the substrate 21. The light emitting element 22 can be, for example, a light emitting diode, an organic light emitting diode, a laser diode, or the like. A plurality of the light emitting elements 22 are provided. The plurality of light emitting elements 22 can be connected to each other in series.

In the light-emitting module 20 illustrated in FIGS. 1 and 2, three light emitting elements 22 are provided. As illustrated in FIG. 2, the three light-emitting elements 22 are connected to each other in series.

The light-emitting element 22 can be a chip-shaped light-emitting element. The chip-shaped light-emitting element 22 is mounted by COB (Chip On Board). In this way, it is possible to provide many light-emitting elements 22 in a narrow region. Therefore, it is possible to reduce the size of the light-emitting module 20, and to eventually reduce the size of the vehicle lighting device 1. The light-emitting element 22 is electrically connected to the wiring pattern 21a by a wiring 21b. The light-emitting element 22 and the wiring pattern 21a can be electrically connected to each other by, for example, a wire bonding method. The light-emitting element 22 may be an upper and lower electrode-type light-emitting element, an upper electrode-type light-emitting element, or a flip chip-type light-emitting element. The light-emitting element 22 exemplified in FIG. 1 is an upper and lower electrode-type light-emitting element. When the light-emitting element 22 is a flip chip-type light-emitting element, the light-emitting element 22 is directly connected to the wiring pattern 21a.

Further, the light-emitting element 22 may be a surface mounting-type light-emitting element or a shell-type light-emitting element including a lead wire.

The first resistor 23 is provided on the side of the substrate 21 opposite to the side of the bottom 11a1 of the recessed portion 11a. The first resistor 23 is provided on the substrate 21. The first resistor 23 is electrically connected to the wiring pattern 21a provided on the surface of the substrate 21, The first resistor 23 can be a surface mounting-type resistor, a resistor with a lead wire (metal oxide film resistor), a film-shaped resistor which is formed using a screen printing method, or the like. The first resistor 23 exemplified in FIG. 1 is a surface mounting-type resistor.

Here, since there are variations in forward voltage characteristics of the light emitting element 22, when an applied voltage between an anode terminal and a ground terminal is made constant, variations occur in brightness of light (light flux, luminance, luminous intensity, and illuminance) irradiated from the light emitting element 22, For this reason, a value of current flowing in the light emitting element 22 is set to be within a predetermined range using the first resistor 23, so that the brightness of light irradiated from the light emitting element 22 falls within a predetermined range. In this case, the value of current flowing in the light emitting element 22 is set to be within the predetermined range, by changing a resistance value of the first resistor 23.

When the first resistor 23 is the surface mounting-type resistor or the resistor with a lead wire, a first resistor 23 having an appropriate resistance value is selected according to the forward voltage characteristics of the light emitting element 22. When the first resistor 23 is the film-shaped resistor, if a part of the first resistor 23 is removed, the resistance value can be increased. For example, when the first resistor 23 is irradiated with a laser beam, a part of the first resistor 23 can be easily removed.

The diode 24 is provided on the side of the substrate 21 opposite to the side of the bottom 11a1 of the recessed portion 11a. The diode 24 is provided on the substrate 21. The diode 24 is electrically connected to the wiring pattern 21a provided on the surface of the substrate 21. The diode 24 is provided to prevent a reverse voltage from being applied to the light-emitting element 22 and to prevent pulse noise in the reverse direction from being applied to the light-emitting element 22.

The diode 24 can be, for example, a surface mounting-type diode or a diode with a lead wire. The diode 24 illustrated in FIG. 1 is a surface mounting-type diode.

In the case of the chip-shaped light-emitting element 22, the frame 25 and the sealing portion 26 can be provided.

The frame 25 is provided on the side of the substrate 21 opposite to the side of the bottom 11a1 of the recessed portion 11a. The frame 25 is provided on the substrate 21.

The frame 25 is bonded to the substrate 21. The frame 25 has, for example, an annular shape, and is disposed therein with a plurality of light-emitting elements 22. That is, the frame 25 surrounds the plurality of light-emitting elements 22. The frame 25 is formed of a resin. The resin can be, for example, a thermoplastic resin such as PBT (polybutylene terephthalate), PC (polycarbonate), PET, nylon), PP (polypropylene), PE (polyethylene), or PS (polystyrene).

Further, the resin is mixed with particles of titanium oxide or the like, and thus a reflectance for the light emitted from the light-emitting element 22 can be improved. The resin may be mixed with particles made of a material having a high reflectance for the light emitted from the light-emitting element 22 instead of the particles of titanium oxide. Further, the frame 25 can also be formed of, for example, a white resin.

An inner wall surface of the frame 25 is a slope inclined in a direction away from the center axis of the frame 25 as the distance from the substrate 21 increases. For this reason, some of the light emitted from the light-emitting element 22 is reflected by the inner wall surface of the frame 25, and is emitted toward a front side of the vehicle lighting device 1. That is, the frame 25 has a function of defining a formation range of the sealing portion 26 and a function of a reflector.

The sealing portion 26 is provided inside the frame 25. The sealing portion 26 is provided to cover the inside of the frame 25. That is, the sealing portion 26 is provided inside the frame 25 and covers the light-emitting element 22, the wiring 21b, and the like. The sealing portion 26 is formed of a material having translucency. The sealing portion 26 can be formed, for example, by filling the inside of the frame 25 with a resin. The resin can be filled using, for example, a liquid dispensing apparatus such as a dispenser. The resin to be filled can be, for example, a silicon resin.

In addition, the sealing portion 26 may include a phosphor. The phosphor can be, for example, a YAG-based phosphor (yttrium-aluminum-garnet-based phosphor). However, the type of the phosphor can be appropriately changed so as to obtain a desired light-emitting color according to the use of the vehicle lighting device 1.

For example, when the light-emitting color is white or umber, two or three InGaN-based blue light-emitting diodes are provided and color conversion is performed using a phosphor. When the light-emitting color is red, three or four AlINGaP-based red light-emitting diodes can be provided.

In addition, only the sealing portion 26 can be provided, but the frame 25 is not provided. When only the sealing portion 26 is provided, a dome-shaped sealing portion 26 is provided on the substrate 21.

The thermistor 27 is provided on the side of the substrate 21 opposite to the side of the bottom 11a1 of the recessed portion 11a. The thermistor 27 is provided on the substrate 21. The thermistor 27 is electrically connected to the wiring pattern 21a provided on the surface of the substrate 21. The thermistor 27 can be a positive temperature coefficient thermistor. The resistance value of thermistor 27, which is the positive temperature coefficient thermistor, rapidly rises when the temperature of the thermistor 27 exceeds the Curie point. The thermistor 27 can include, for example, a material having a heat conductivity of 6 W/m k or more. The thermistor 27 can include barium titanate, for example.

A plurality of thermistors 27 are provided. The number of the thermistors 27 can be appropriately changed according to the value of the total current to be set. The plurality of thermistors 27 are connected to each other in parallel. In the case illustrated in FIG. 2, three thermistors 27 are provided to be connected to each other in parallel.

In addition, the plurality of thermistors 27 connected to each other in parallel are connected in series to the plurality of light-emitting elements 22 connected in series to each other. Here, a voltage is applied to the light-emitting module 20, thereby turning the vehicle lighting device 1 on. Then, a current flows through the light-emitting element 22 to generate heat, and the temperature of the light-emitting element 22 rises.

The vehicle lighting device 1 uses a battery as a power supply, but the voltage applied to the vehicle lighting device 1 fluctuates. For example, an operating standard voltage (rated voltage) of the vehicle lighting device 1 for a general automobile is about 13.5 V, but a higher voltage may be applied in some cases. When the voltage applied to the light-emitting module 20 increases, the temperature of the light-emitting element 22 becomes too high, and the light-emitting element 22 may be broken or the lifetime of the light-emitting element 22 may be shortened.

Therefore, the light-emitting module 20 is provided with the thermistor 27. When a current flows through the thermistor 27, heat is generated and the temperature of the thermistor 27 rises. In addition, as the voltage applied to the vehicle lighting device 1 (light-emitting module 20) increases, the temperature of the thermistor 27 increases. As described above, when the temperature of the thermistor 27 exceeds the Curie point, the resistance value of the thermistor 27 increases. When the resistance value of the thermistor 27 increases, the current flowing through the light-emitting element 22 decreases, and thus the temperature rise of the light-emitting element 22 can be prevented.

Figure 3:
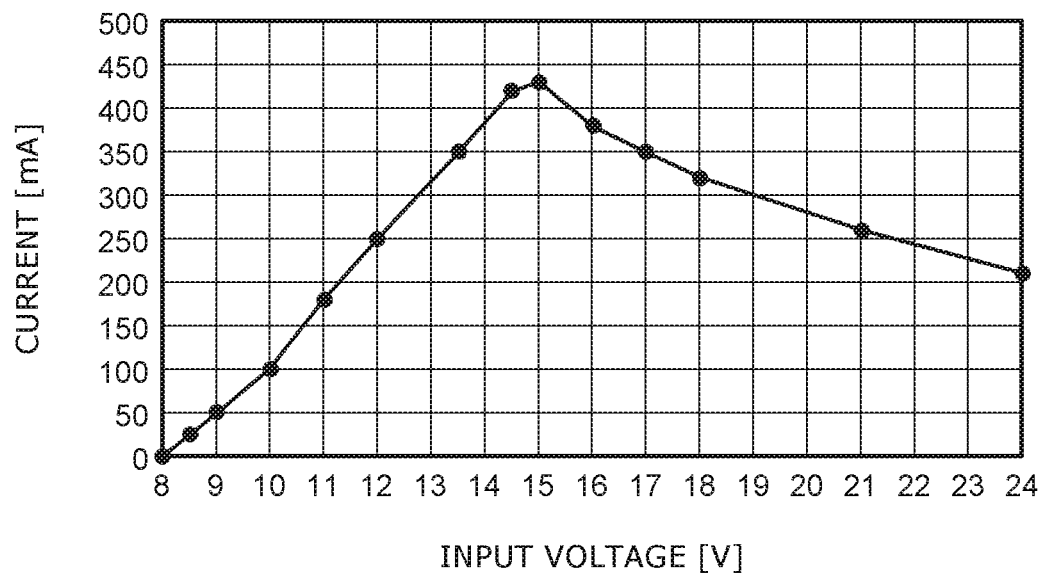
FIG. 3 is a graph for illustrating voltage-current characteristics of a light-emitting element.

FIG. 3 is a graph for illustrating voltage-current characteristics of the light-emitting element 22.

The light-emitting element 22 is an InGaN-based light-emitting diode. A driving current at the rated voltage (13.5 V) is 350 mA. When the input voltage (battery voltage) ranges from 12 V to 14.5 V, the resistance value of the thermistor 27 is set not to rise. Details regarding the setting of the thermistor 27 will be described below.

As can be seen from FIG. 3, when the voltage becomes 14.5 V or more, the resistance value of the thermistor 27 increases, and the current value of the light-emitting element 22 decreases. Further, even when a 24 V battery is erroneously connected, since the current value of the light-emitting element 22 can be suppressed, malfunction of the light-emitting element 22 can be prevented.

Figure 4:
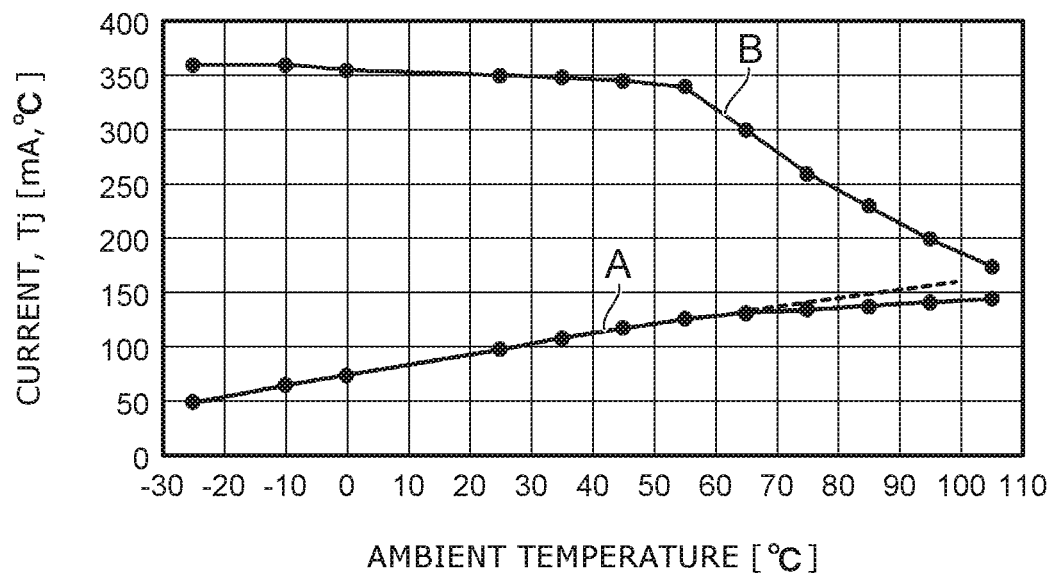
FIG. 4 is a graph for illustrating a relation between an ambient temperature and a junction temperature of the light-emitting element and a relation between the ambient temperature and a current value of the light-emitting element.

FIG. 4 is a graph for illustrating a relation between an ambient temperature and a junction temperature Tj of the light-emitting element 22 and a relation between the ambient temperature and the current value of the light-emitting element 22.

In the drawing, "A" represents the relation between the ambient temperature and the junction temperature Tj of the light-emitting element 22, and "B" represents the relation between the ambient temperature and the current value of the light-emitting element 22.

The light-emitting element 22 is an InGaN-based light-emitting diode, and the maximum value of the junction temperature Tj is 150° C. When the ambient temperature exceeds 55° C., the resistance value of the thermistor 27 is set to increase.

When the ambient temperature rises in a state where the light-emitting element 22 is turned on, the junction temperature Tj of the light-emitting element 22 rises as can be seen from A.

In this case, when the ambient temperature exceeds 55° C., an increase in the resistance value of the thermistor 27 occurs. Therefore, when the ambient temperature exceeds 55° C., the current value of the light-emitting element 22 decreases at B, and the rise of the junction temperature Tj is prevented even at A.

For an exterior light source for automobile, the ambient temperature may be about 70° C. to 100° C. However, if an appropriate thermistor 27 is provided, the junction temperature Tj of the light-emitting element 22 can be prevented from exceeding the maximum value.

As described above, if the thermistor 27 is provided, the malfunction of the light-emitting element 22 can be prevented or the lifetime of the light-emitting element 22 can be prevented from being shortened.

In addition, when the plurality of thermistors 27 are connected in parallel to each other, the amount of change in the resistance value can be reduced. As will be described below, the resistance value of the thermistor 27 may vary by about ±20%. When the resistance value of the thermistor 27 varies, the brightness of the light irradiated from the light-emitting element 22 may vary. Accordingly, when the plurality of thermistor 27 are connected in parallel to each other, the variation in the resistance value can be reduced.

Since the amount of change in the resistance value can be reduced when the plurality of thermistor 27 are connected in parallel to each other, the amount of change in the value of the current flowing through the light-emitting element 22 can be reduced. Therefore, it is possible to prevent sudden fluctuation of the total light flux when the temperature of the thermistor 27 exceeds the Curie point.

Here, when a voltage is applied to the light-emitting module 20, a current also flows through the first resistor 23 and the second resistor 28 to generate heat. For this reason, some of the heat generated in the light-emitting element 22, the first resistor 23, and the second resistor 28 is transferred to the thermistor 27 through the substrate 21.

That is, the temperature of the thermistor 27 is influenced by self-heating, thermal interference due to the light-emitting element 22, and the ambient temperature.

When the plurality of thermistors 27 are provided, it is preferable that variations in temperature in the plurality of thermistors 27 be reduced. In this case, since the voltages applied to the plurality of thermistors 27 are the same, the self-heating amounts in the plurality of thermistors 27 are substantially equal to each other. The ambient temperatures of the plurality of thermistors 27 are substantially equal to each other. Therefore, when the respective thermal interferences of the plurality of thermistors 27 are equalized, variations in temperature in the plurality of thermistors 27 are reduced.

Figure 5:
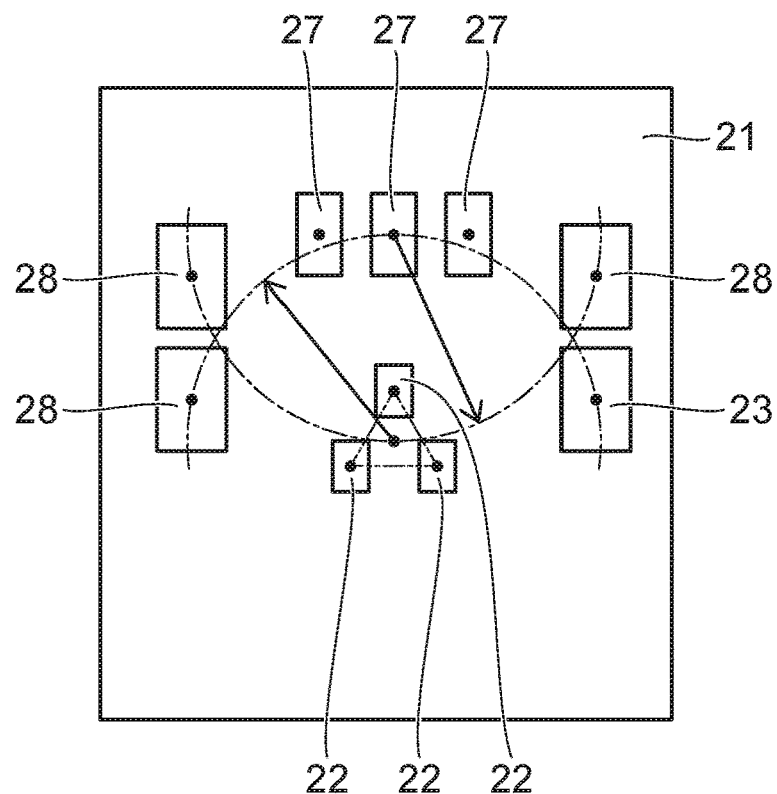
FIG. 5 is a schematic plan view illustrating an arrangement of a light-emitting element, a first resistor, a thermistor, and a second resistor.

FIG. 5 is a schematic plan view illustrating an arrangement of the light-emitting element 22, the first resistor 23, the thermistor 27, and the second resistor 28.

In the case of the example illustrated in FIG. 5, three thermistors 27 are provided side by side in the vicinity of the peripheral edge of the substrate 21. The three thermistors 27 are provided in the vicinity of the center of the side of the substrate 21. The number of thermistors 27 can be changed by the total current to be set. For example, the number of thermistors 27 may be two.

The first resistor 23 and the second resistor 28 are provided so as to be interposed between the three thermistors 27, In this case, the number of resistors provided on one side of the three thermistors 27 is preferably set to be equal to the number of resistors provided on the other side. In this way, it is possible to disperse heat and to transfer the same degree of heat to the three thermistors 27 from both sides.

In the case of the example illustrated in FIG. 5, three light-emitting elements 22 are provided. The center of gravity of the group of the light-emitting elements 22 can be provided at the center of gravity of the substrate 21.

In order to equalize the thermal interference in the three thermistors 27, a positional relation between three light-emitting elements 22 having the largest heating value and three thermistors 27 is preferably set in an appropriate manner.

In this case, the center of gravity of each of the three thermistors 27 is preferably provided on the circumference centered on the center of gravity of the group of the light-emitting elements 22. For example, since the substrate 21 is formed of a material having high heat conductivity, the center of gravity of each of the plurality of thermistors 27 may be provided at a position deviated by about ±2 mm from the circumference (corresponding to an example of a position in the vicinity of the circumference).

That is, the center of gravity of each of the plurality of thermistors 27 is provided within a range of ±2 mm from the circumference centered on the center of gravity of the group of the light-emitting elements 22.

Next, a positional relation between three second resistors 28 having the large heating value and three thermistors 27 is preferably set in an appropriate manner.

In this case, the center of gravity of each of three second resistors 28 is preferably provided on the circumference centered on the center of gravity of the group of the thermistors 27. For example, since the substrate 21 is formed of a material having high heat conductivity, the center of gravity of each of the plurality of second resistors 28 may be provided at a position deviated by about ±2 mm from the circumference (corresponding to an example of a position in the vicinity of the circumference).

In addition, the center of gravity of the first resistor 23 is preferably provided on the circumference. For example, since the substrate 21 is formed of a material having high heat conductivity, the center of gravity of the first resistor 23 may be provided at a position deviated by about ±2 mm from the circumference (corresponding to an example of a position in the vicinity of the circumference).

That is, the center of gravity of each of the plurality of resistors 28 and 23 is provided within a range of ±2 mm from the circumference centered on the center of gravity of the group of the thermistors 27.

Figure 6:
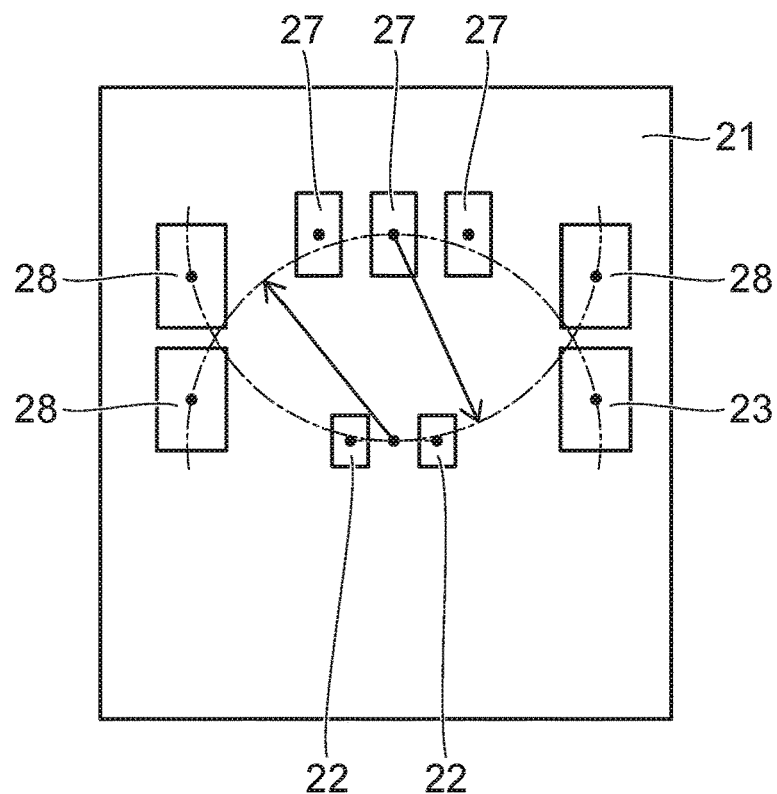
FIG. 6 is a schematic plan view illustrating an arrangement of a light-emitting element, a first resistor, a thermistor, and a second resistor according to another embodiment.

FIG. 6 is a schematic plan view illustrating an arrangement of the light-emitting element 22, the first resistor 23, the thermistor 27, and the second resistor 28 according to another embodiment.

In the case of the example illustrated in FIG. 6, two light-emitting elements 22 are provided. The center of gravity of the light-emitting element 22 can be provided at the center of gravity of the substrate 21.

As described above, the center of gravity of each of the three thermistors 27 is preferably provided on the circumference centered on the center of gravity of the group of the light-emitting elements 22. For example, since the substrate 21 is formed of a material having high heat conductivity, the center of gravity of each of the plurality of thermistors 27 may be provided at a position deviated by about ±2 mm from the circumference (corresponding to an example of a position in the vicinity of the circumference).

That is, the center of gravity of each of the plurality of thermistors 27 is provided within a range of ±2 mm from the circumference centered on the center of gravity of the group of the light-emitting elements 22.

Next, a positional relation between three second resistors 28 having the large heating value and three thermistors 27 is preferably set in an appropriate manner.

In this case, the center of gravity of each of three second resistors 28 is preferably provided on the circumference centered on the center of gravity of the group of the thermistors 27. For example, since the substrate 21 is formed of a material having high heat conductivity, the center of gravity of each of the plurality of second resistors 28 may be provided at a position deviated by about ±2 mm from the circumference (corresponding to an example of a position in the vicinity of the circumference).

In addition, the center of gravity of the first resistor 23 is preferably provided on the circumference. For example, since the substrate 21 is formed of a material having high heat conductivity, the center of gravity of the first resistor 23 may be provided at a position deviated by about ±2 mm from the circumference (corresponding to an example of a position in the vicinity of the circumference).

That is, the center of gravity of each of the plurality of resistors 28 and 23 is provided within a range of ±2 mm from the circumference centered on the center of gravity of the group of the thermistors 27.

Figure 7:
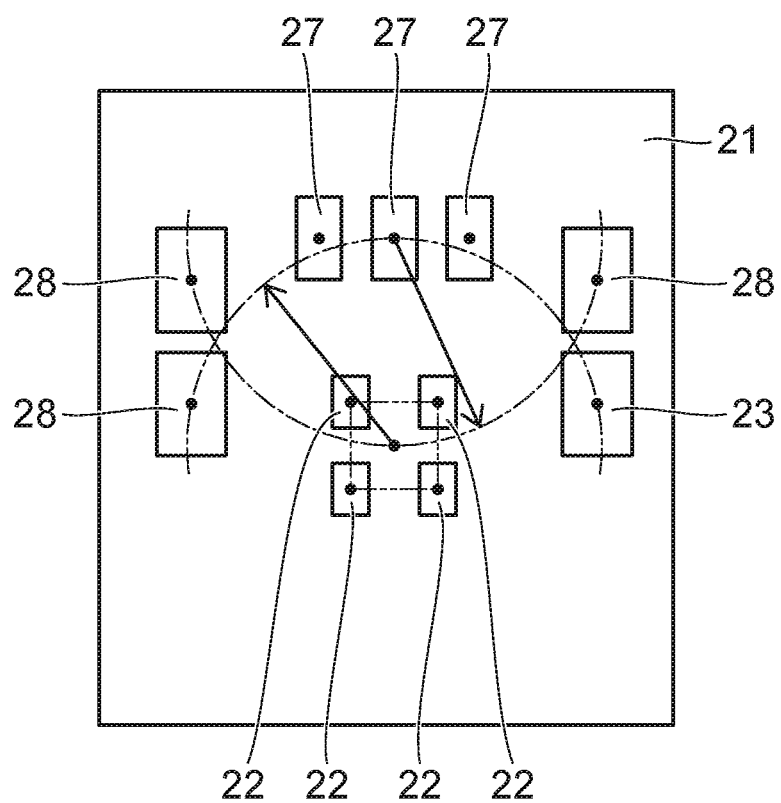
FIG. 7 is a schematic plan view illustrating an arrangement of a light-emitting element, a first resistor, a thermistor, and a second resistor according to another embodiment.

FIG. 7 is a schematic plan view illustrating an arrangement of the light-emitting element 22, the first resistor 23, the thermistor 27, and the second resistor 28 according to another embodiment.

In the case of the example illustrated in FIG. 7, four light-emitting elements 22 are provided. The center of gravity of the light-emitting element 22 can be provided at the center of gravity of the substrate 21.

As described above, the center of gravity of each of the three thermistors 27 is preferably provided on the circumference centered on the center of gravity of the group of the light-emitting elements 22. For example, since the substrate 21 is formed of a material having high heat conductivity, the center of gravity of each of the plurality of thermistors 27 may be provided at a position deviated by about ±2 mm from the circumference (corresponding to an example of a position in the vicinity of the circumference).

That is, the center of gravity of each of the plurality of thermistors 27 is provided within a range of ±2 mm from the circumference centered on the center of gravity of the group of the light-emitting elements 22.

Next, a positional relation between three second resistors 28 having the large heating value and three thermistors 27 is preferably set in an appropriate manner.

In this case, the center of gravity of each of three second resistors 28 is preferably provided on the circumference centered on the center of gravity of the group of the thermistors 27. For example, since the substrate 21 is formed of a material having high heat conductivity, the center of gravity of the second resistor 28 may be provided at a position deviated by about ±2 mm from the circumference (corresponding to an example of a position in the vicinity of the circumference).

In addition, the center of gravity of the first resistor 23 is preferably provided on the circumference. For example, since the substrate 21 is formed of a material having high heat conductivity, the center of gravity of each of the plurality of first resistors 23 may be provided at a position deviated by about ±2 mm from the circumference (corresponding to an example of a position in the vicinity of the circumference).

That is, the center of gravity of each of the plurality of resistors 28 and 23 is provided within a range of ±2 mm from the circumference centered on the center of gravity of the group of the thermistors 27.

As exemplified above, the plurality of light-emitting elements 22 can be provided in the central region of the substrate 21. The plurality of thermistors 27 can be provided in the peripheral edge region of the substrate 21. The center of gravity of each of the plurality of thermistors 27 can be provided on the circumference or around the circumference centered on the center of gravity of the group of the light-emitting elements 22. With such an arrangement, it is possible to equalize the thermal interference in the plurality of thermistors 27. For this reason, since the variations in the temperature of the plurality of thermistors 27 are reduced, the current control of the light-emitting element 22 described above can be appropriately performed.

The second resistor 28 is provided on the side of the substrate 21 opposite to the side of the bottom 11a1 of the recessed portion 11a. The second resistor 28 is provided on the substrate 21. The second resistor 28 is electrically connected to the wiring pattern 21a provided on the surface of the substrate 21. At least one second resistor 28 may be provided. When a plurality of second resistors 28 are provided, the plurality of second resistors 28 can be connected in series to each other.

As illustrated in FIG. 2, the plurality of second resistors 28 connected in series to each other, the plurality of first thermistors 27 connected in parallel to each other, the first resistor 23, and the plurality of light-emitting elements 22 connected in series to each other can be connected in series to each other.

The second resistor 28 may be, for example, a surface mounting-type resistor, a resistor with a lead wire (metal oxide film resistor), or a film-shaped resistor formed using a screen printing method. The second resistor 28 illustrated in FIG. 1 is a film-shaped resistor.

A material of the film-shaped resistor can be, for example, ruthenium oxide ($RuO_2$). The film-shaped resistor can be formed by, for example, a screen printing method and a firing method. When the second resistor 28 is a film-shaped resistor, a contact area between the second resistor 28 and the substrate 21 can be increased, and thus the thermal radiation properties can be improved. In addition, the plurality of second resistors 28 can be formed at a time. For this reason, the productivity can be improved, and variations in the resistance values of the plurality of second resistors 28 can be prevented.

Here, the resistance value of the thermistor 27, which is a positive temperature coefficient thermistor, may vary by about ±2:20%. When the resistance value of the thermistor 27 varies, the brightness of the light irradiated from the light-emitting element 22 may vary.

Therefore, the value of the current flowing in the light-emitting module 20 is mainly adjusted by the second resistor 28 so that the value of the current flowing in the light-emitting module 20 falls within a predetermined range. In this case, the value of current flowing in the light emitting element 22 is set to be within the predetermined range, by changing the resistance value of the second resistor 28.

When the second resistor 28 is the surface mounting-type resistor or the resistor with a lead wire, a second resistor 28 having an appropriate resistance value is selected according to the resistance value of the thermistor 27.

When the second resistor 28 is the film-shaped resistor, if a part of the second resistor 28 is removed, the resistance value can be increased. For example, when the second resistor 28 is irradiated with a laser beam, a part of the second resistor 28 can be easily removed. Accordingly, when the second resistor 28 is a film-shaped resistor, the current value is easily adjusted.

Here, if the first resistor 23 and the second resistor 28 are film-shaped resistors, the current value is easily adjusted. However, the voltage applied to the vehicle lighting device 1 fluctuates as described above. For this reason, the variation in current value due to the fluctuation of the voltage applied to the vehicle lighting device 1 is also preferably adjusted by the first resistor 23 or the second resistor 28. However, since the variation in current value becomes relatively large, the variation in current value is hardly adjusted by the film-shaped resistor. In the embodiment, therefore, the first resistor 23 is a surface mounting-type resistor having a large adjustment width or a resistor with a lead wire, and the second resistor 28 is a film-shaped resistor which is easy to adjust.

It should be noted that any one of the first resistor 23 and the plurality of second resistors 28 may be a surface mounting-type resistor or a resistor with a lead wire, and the others may be a film-shaped resistor.

For example, at least one of the plurality of resistors may be a film-shaped resistor.

As described above, the light-emitting module 20 includes the plurality of resistors (the first resistor 23 and the second resistor 28). The plurality of resistors connected in series to each other are connected in series with the plurality of thermistors 27 connected in parallel to each other and the plurality of light-emitting elements 22 connected in series to each other. The plurality of resistors are divided into two groups with the plurality of thermistors 27 interposed therebetween. The center of gravity of each of the plurality of resisters is provided on the circumference or around the circumference centered on the center of gravity of the group of the thermistors 27. At least one of the plurality of resistors may be a film-shaped resistor.

As illustrated in FIG. 2, the light-emitting module 20 may further include a capacitor, an ESD (Electro-Static Discharge) protection element, and the like.

In addition, a pull-down resistor can be provided for detection of disconnection of the light-emitting element 22 and prevention of erroneous lighting. Further, a covering portion can be provided to cover the wiring pattern 21a and the film-shaped resistor. The covering portion may include, for example, a glass material.

The power feeding unit 30 includes a plurality of power-supply terminals 31 and the insulating portion 32.

The power-supply terminal 31 can be set to a rod-shaped body. There is no particular limitation on a sectional shape of the power-supply terminal 31. The sectional shape of the power-supply terminal 31 can be, for example, a polygon such as a quadrangle, a circle, or the like. The plurality of power-supply terminals 31 protrude from the bottom 11a1 of the recessed portion 11a. The plurality of power-supply terminals 31 can be provided side by side in a predetermined direction. The power-supply terminals 31 is provided inside the insulating portion 32. The insulating portion 32 is provided between the power-supply terminal 31 and the socket 10. The plurality of power-supply terminals 31 extend inside the insulating portion 32 and protrude from an end face of the insulating portion 32 on the side of the light-emitting module 20 and an end face of the insulating portion 32 on the side of the thermal radiation fin 14. The ends of the plurality of power-supply terminals 31 on the side of the light-emitting module 20 are electrically and mechanically connected to the wiring pattern 21a provided on the substrate 21. That is, one end of the power-supply terminal 31 is soldered to the wiring pattern 21a. The ends of the plurality of power-supply terminals 31 on the side of the thermal radiation fin 14 are exposed into the hole 10b. The connector 105 is fitted to the plurality of power-supply terminals 31 which are exposed into the hole 10b. The power-supply terminal 31 has conductivity. The power-supply terminal 31 can be formed of a metal such as a copper alloy, for example. The number, shape, arrangement, and material of the power-supply terminal 31 are not limited to the examples, and can be appropriately changed.

As described above, the socket 10 is preferably formed of a material having high heat conductivity. However, the material having high heat conductivity may have conductivity in some cases. For example, a high heat conductivity resin containing filler made of carbon has conductivity. Therefore, the insulating portion 32 is provided to insulate between the power-supply terminal 31 and the socket 10 having conductivity. In addition, the insulating portion 32 also has a function of holding the plurality of power-supply terminals 31. In the case where the socket 10 is formed on a high heat conductivity resin (for example, high heat conductivity resin containing filler made of ceramics) having an insulating property, the insulating portion 32 can be omitted. In this case, the socket 10 holds the plurality of power-supply terminals 31.

The insulating portion 32 has an insulating property. The insulating portion 32 can be formed of a resin having an insulating property.

Here, in the case of the lighting device 1 installed in the automobile, the temperature of the use environment is −40° C. to 85° C. Therefore, the coefficient of thermal expansion of the material of the insulating portion 32 is preferably made as close as possible to the coefficient of thermal expansion of the material of the socket 10. In this way, the thermal stress generated between the insulating portion 32 and the socket 10 can be reduced. For example, the material of the insulating portion 32 may be a high heat conductivity resin contained in the socket 10 or a resin contained in the high heat conductivity resin.

For example, the insulating portion 32 can be press-fitted into the hole 10a provided in the socket 10 or can be bonded to the inner wall of the hole 10a.

The heat transfer unit 40 is provided between the substrate 21 and the bottom 11a1 of the recessed portion 11a. The heat transfer unit 40 is provided on the bottom 11a1 of the recessed portion 11a through a bonding portion. That is, the heat transfer unit 40 is bonded to the bottom 11a1 of the recessed portion 11a.

An adhesive having high heat conductivity is preferably used for bonding the transfer unit 40 and the substrate 21, and for bonding the heat transfer unit 40 and the bottom 11a1 of the recessed portion 11a. For example, the adhesive may be an adhesive mixed with filler using an inorganic material. The inorganic material is preferably a material having high heat conductivity (for example, ceramics such as aluminum oxide or aluminum nitride). The heat conductivity of the adhesive can be, for example, 0.5 W/(m·K) or more and 10 W/(m·K) or less.

The heat transfer unit 40 is provided to facilitate transfer of heat generated in the light-emitting module 20 to the socket 10. For this reason, the heat transfer unit 40 is preferably formed of a material having high heat conductivity. The heat transfer unit 40 has a plate shape, and can be formed of a metal such as aluminum, aluminum alloy, copper, or copper alloy.

For example, the heat transfer unit 40 is provided between one end of the socket 10 and the light-emitting module 20. The heat transfer unit 40 has a plate shape. The heat transfer unit 40 contains a metal.

FIG. 8 is a table for illustrating an example of the first resistor 23, the thermistor 27, and the second resistor 28.

The resistance value of the thermistor 27 is a resistance value at room temperature (25° C.). In addition, the total resistance value is a sum of a combined resistance value of a plurality of thermistors 27 connected in parallel, a combined resistance value of a plurality of second resistors 28 connected in series, a resistance value of the first resistance 23.

When the vehicle lighting device 1 is a daytime running lamp, a stop lamp, or the like, the light-emitting color can be white. When the vehicle lighting device 1 is a turn signal lamp or the like, the light-emitting color can be umber.

When the light-emitting color is white, the luminous flux needs to be 350 lm (lumens). Therefore, as illustrated in FIG. 8, the rated current is set to 350 mA. In addition, two thermistors 27 are connected in parallel. The combined resistance value of three second resistors 28 is 7.75Ω, and the first resistor 23 is 1.8Ω. As a result, the current (rated current) during stabilization becomes 350 mA, the target luminous flux can be obtained. The size of the thermistor 27 is set to 2012. The current flowing per one thermistor 271 is set to 250 mA or less, and the number of thermistor 27 is set to two. The resistance value of the thermistor 27 (the combined resistance value/total resistance value of the thermistor 27 at room temperature (25° C.)) becomes 19.6%. The resistance value of the first resistor 23 (the resistance value/total resistance value of the first resistor 23) becomes 15.1%.

When the light-emitting color is umber, the luminous flux needs to be 250 lm (lumens). Therefore, as illustrated in FIG. 8, the rated current is 450 mA. Since the umber is used in a turn signal lamp or the like, the lighting state is flickering. The size of the thermistor 27 is set to 2012. The current flowing per one thermistor 27 is set to 250 mA or less, and the number of thermistors 27 is set to three. The resistance ratio of the thermistor 27 becomes 18.5%. The resistance ratio of the first resistor 23 becomes 12.7%.

As illustrated in FIG. 8, if the resistance value and the current value of the thermistor 27 are within a predetermined range, it is possible to prevent the current fluctuation and fluctuation of the light flux due to the resistance value fluctuation in the normal operation region.

In this case, when the resistance ratio of the thermistor 27 increases, the voltage at which the resistance value of the thermistor 27 starts to increase decreases. For example, the position of the peak in FIG. 3 moves to the left. Therefore, the current value of the light-emitting element 22 may decrease at a voltage lower than the upper limit of the rated voltage.

On the other hand, when the resistance ratio of the thermistor 27 decreases, the junction temperature Tj of the light-emitting element 22 increases. For example, A in FIG. 4 moves upward. Therefore, for example, the junction temperature Tj may exceed the maximum value even when the ambient temperature is 55° C. or less.

According to the knowledge obtained by the present inventors, it is preferable that the resistance ratio of the thermistor 27 is 15% or more and 25% or less. In this way, it is possible to start increasing the resistance value of the thermistor 27 in the vicinity of the upper limit of the rated voltage.

In addition, the resistance ratio of the first resistor 23 is preferably set to 10% or more and 20% or less. In this way, even when the voltage applied to the vehicle lighting device 1 fluctuates, it is possible to prevent variations in the brightness of the light emitted from the vehicle lighting device 1.

Next, thermal radiation and thermal interference of the light-emitting element 22, the first resistor 23, the second resistor 28, and the thermistor 27 will be described.

If the heat generated in the light-emitting element 22, the first resistor 23, and the second resistor 28 is more likely to be transmitted to the thermal radiation unit 40 via the substrate 21, the thermal interference to the thermistor 27 can be prevented. Therefore, it is preferable to improve the thermal radiation properties of the light-emitting element 22, the first resistor 23, and the second resistor 28.

In addition, if heat generated in the thermistor 27 is more likely to be transmitted to the thermal radiation unit 40 via the substrate 21, thermal interference to the light-emitting element 22, that is, temperature rise in the light-emitting element 22 can be prevented. Therefore, it is preferable to improve the thermal radiation properties of the thermistor 27.

Figure 9:
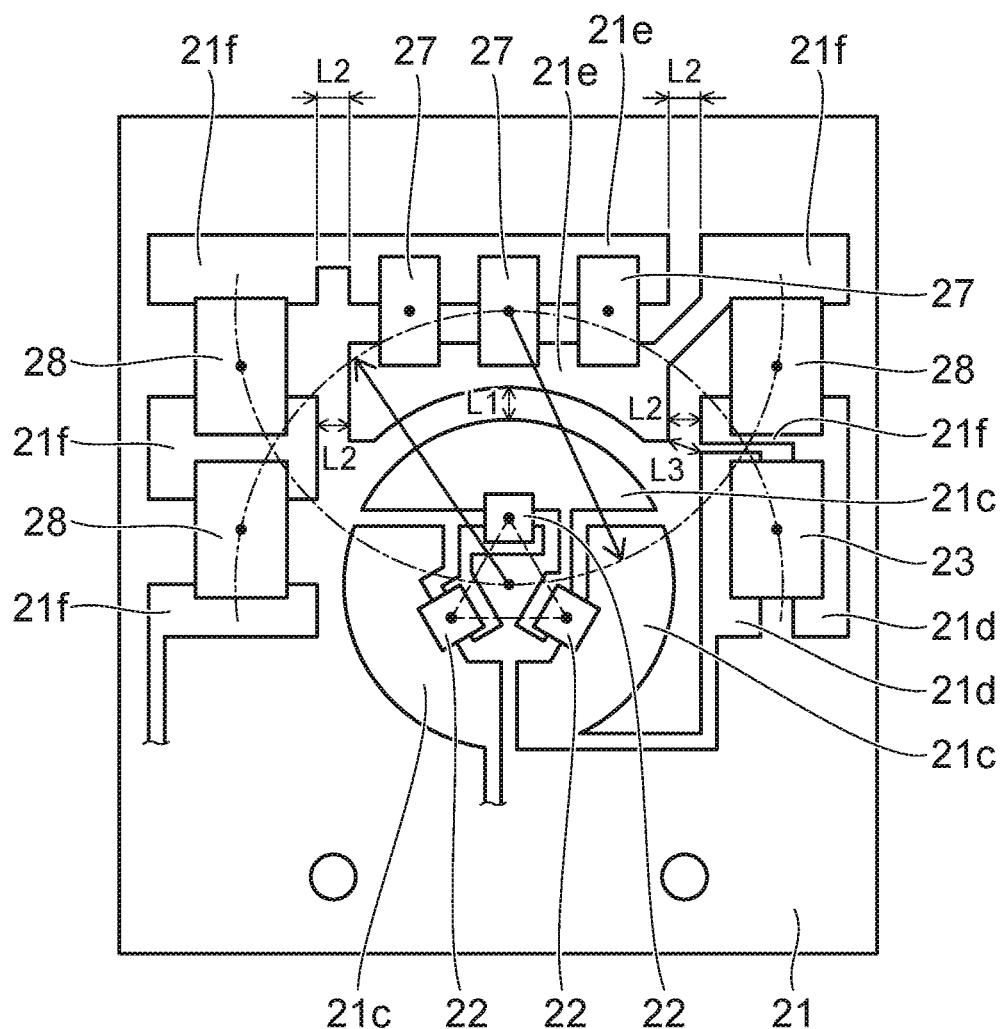
FIG. 9 is a schematic plan view illustrating thermal radiation and thermal interference.

FIG. 9 is a schematic plan view for illustrating thermal radiation and thermal interference.

In the case illustrated in FIG. 9, three thermistors 27 are provided side by side in the vicinity of the periphery of the substrate 21. The three thermistors 27 are provided in the vicinity of the center of the side of the substrate 21. The number of the thermistors 27 can be changed by the total current to be set. For example, the number of thermistors 27 can be set to two.

The first resistor 23 and the second resistor 28 are provided so as to sandwich the three thermistors 27. In this case, it is preferable that the number of resistors provided on one side of the three thermistors 27 be equal to the number of resistors provided on the other side. In this way, it is possible to disperse heat, and to transmit the same degree of heat to the three thermistors 27 from both sides.

In the case illustrated in FIG. 9, three light-emitting elements 22 are provided. The center of gravity of the group of the light-emitting element 22 can be provided at the center of gravity of the substrate 21.

In addition, the wiring pattern 21a is provided with a pad 21c (corresponding to an example of a first pad) to which the light-emitting element 22 is electrically connected, a pad 21d (corresponding to an example of a third pad) to which the first resistor 23 is electrically connected, a pad 21e (corresponding to an example of a second pad) to which the thermistor 27 is electrically connected, and a pad 21f (corresponding to an example of the third pad) to which the second resistor 28 is electrically connected.

The light-emitting element 22 is provided on the pad 21c. The pad 21c has a shape extending outward from the light-emitting element 22. The total area of the plurality of pads 21c in plan view can be made larger than the total area of the plurality of light-emitting elements 22.

The first resistor 23 is provided on the pad 21d. The pad 21d has a shape extending outward from the first resistor 23. The total area of the plurality of pads 21d in plan view can be made larger than the total area of the first resistor 23.

The thermistor 27 is provided on the pad 21e. The pad 21e has a shape extending outward from the thermistor 27. The total area of the plurality of pads 21e in plan view can be made larger than the total area of the plurality of thermistors 27.

The second resistor 28 is provided on the pad 21f. The pad 21f has a shape extending outward from the second resistor 28. The total area of the plurality of pads 21f in plan view can be made larger than the total area of the plurality of second resistors 28.

Providing such pads 21c to 21f facilitates transfer of heat generated in each element to the thermal radiation unit 40 via the substrate 21. Therefore, it is possible to prevent the thermal interference to the thermistor 27 and the temperature rise in the light-emitting element 22

In order to make the thermal interference of the three thermistors 27 equal to each other, it is preferable to set the appropriate positional relationship between the three light-emitting elements 22 having the largest heating value and the three thermistors 27.

In this case, similarly to the above, it is preferable that the center of gravity of each of the three thermistors 27 is provided on the circumference around the center of gravity of the group of the light-emitting elements 22 or in the vicinity of the circumference.

In addition, it is preferable to set the appropriate positional relationship between the three second resistors 28 having the large heating value and the three thermistors 27.

In this case, similarly to the above, it is preferable that the center of gravity of each of the three second resistors 28 be provided on the circumference around the center of gravity of the group of the thermistors 27 or in the vicinity of the circumference. Further, it is preferable that the center of gravity of the first resistor 23 is provided on the circumference or in the vicinity of the circumference.

However, with such an arrangement, the light-emitting element 22, the first resistor 23, the thermistor 27, and the second resistor 28 are densely arranged, and the distance between the pads 21c to 21f is shortened. Since the pads 21c to 21f are part of the wiring pattern 21a, and the pads are formed of metal such as silver or copper, heat generated in the light-emitting element 22 and the like is likely to be transmitted to the periphery of the pads 21c to 21f. Therefore, when the distance between the pads 21c to 21f is shortened, heat is transferred between the pads 21c to 21f, and thermal interference may not be prevented.

In this case, heat generated in the light-emitting element 22 and the like is transmitted to the thermal radiation unit 40 via the pads 21c to 21f and the substrate 21. Also, heat is transmitted via the substrate 21 in between the pads 21c to 21f. Therefore, if the heat transfer distance on the substrate 21 is increased, the transmission of heat can be prevented.

In the present embodiment, as illustrated in FIG. 9, the shortest distance L1 between the pad 21c and the pad 21e is made larger than the thickness of the substrate 21.

The shortest distance L2 between the pad 21f and the pad 21e is made larger than the thickness of the substrate 21.

The shortest distance L3 between the pad 21d and the pad 21e is made larger than the thickness of the substrate 21.

The heating value is often "the heating value of the light-emitting element 22≥the heating value of the second resistor 28≥the heating value of the first resistor 23". Therefore, "the distance L1≥the distance L2≥the distance L3" can also be set.

Figure 10:
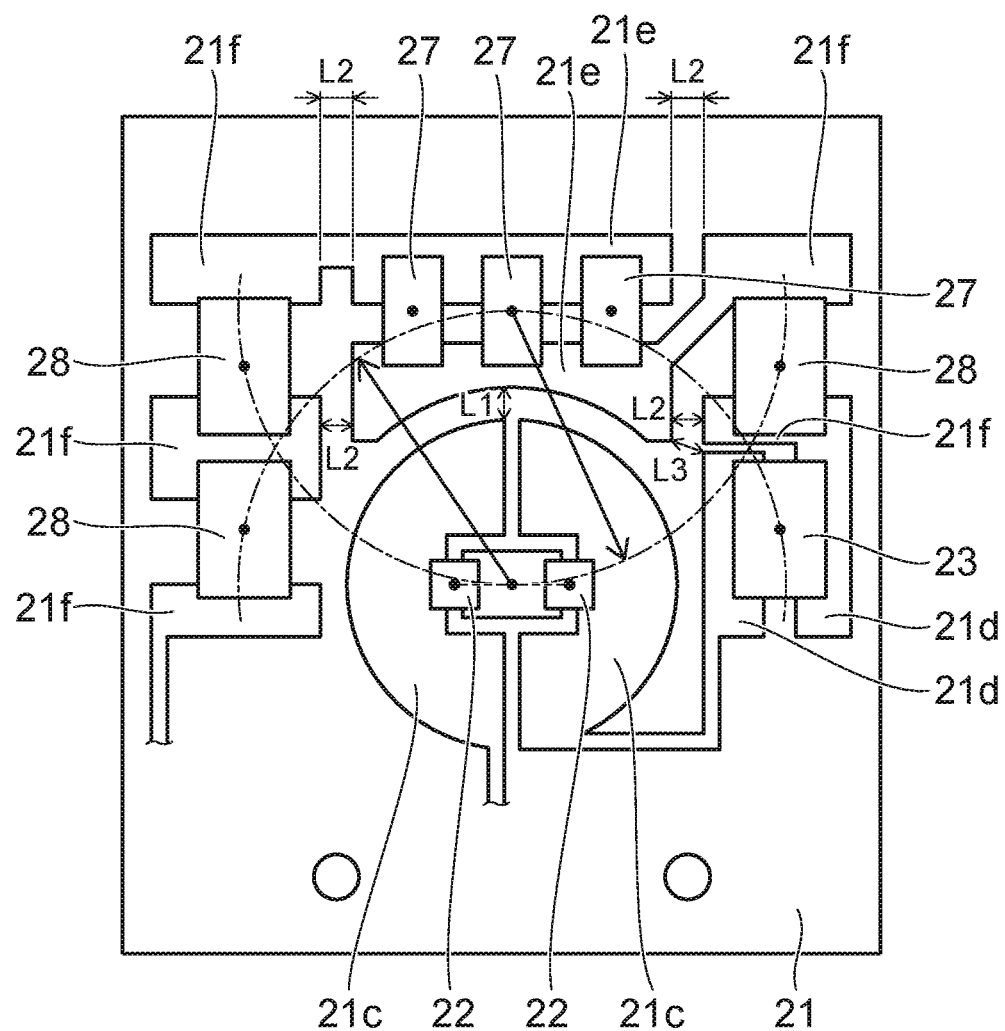
FIG. 10 is a schematic plan view illustrating an arrangement of a light-emitting element, a first resistor, a thermistor, and a second resistor according to another embodiment.

FIG. 10 is a schematic plan view for illustrating the arrangement of a light-emitting element 22, a first resistor 23, a thermistor 27, and a second resistor 28 of another exemplary embodiment.

In the case illustrated in FIG. 10, two light-emitting elements 22 are provided. The center of gravity of the group of the light-emitting elements 22 can be provided at the center of gravity of the substrate 21.

Similarly to the above description, the pad 21c has a shape extending outward from the light-emitting element 22. The total area of the plurality of pads 21c in plan view can be made larger than the total area of the plurality of light-emitting elements 22.

In addition, the shortest distance L1 between the pad 21c and the pad 21e is made larger than the thickness of the substrate 21. Further, it can be set to "the distance L1 the distance L2 the distance L3."

Others can be the same as those illustrated in FIG. 9.

Figure 11:
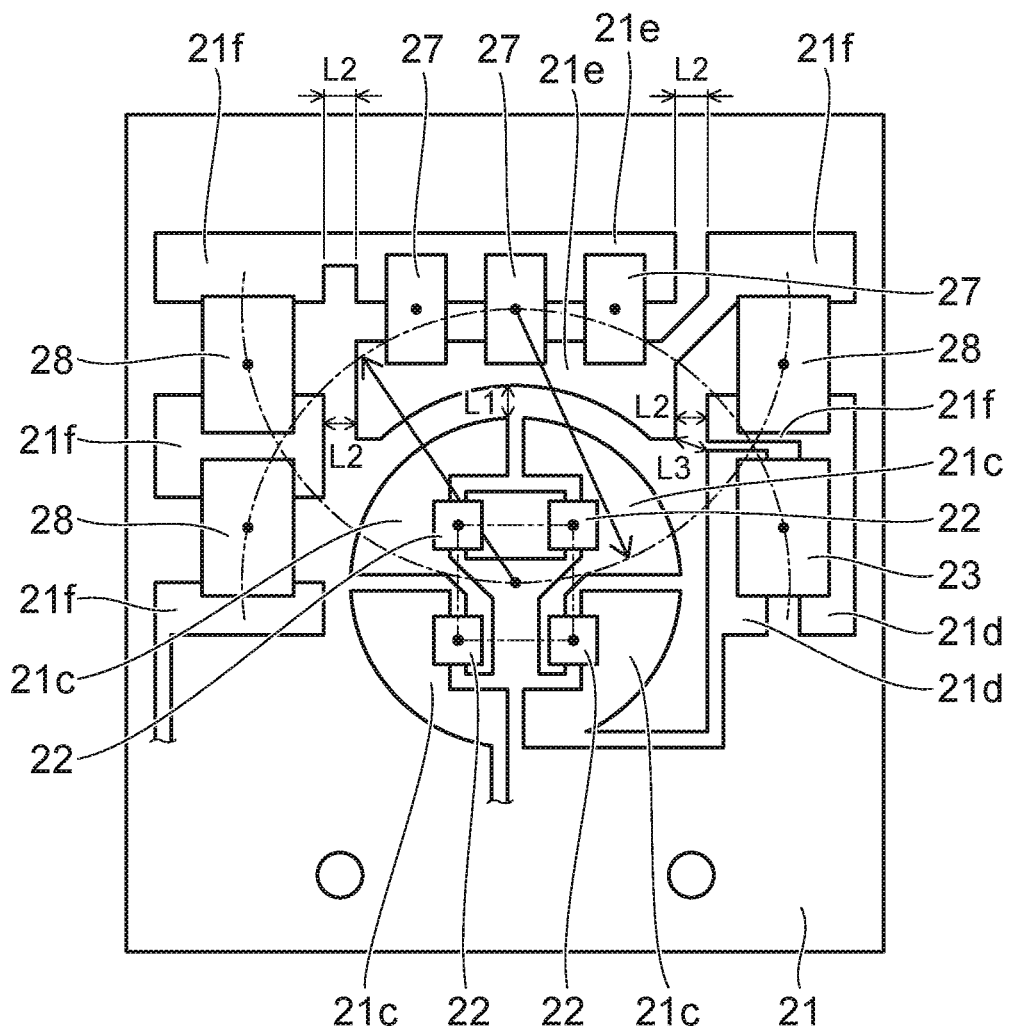
FIG. 11 is a schematic plan view illustrating an arrangement of a light-emitting element, a first resistor, a thermistor, and a second resistor according to another embodiment.

FIG. 11 is a schematic plan view for illustrating the arrangement of a light-emitting element 22, a first resistor 23, a thermistor 27, and a second resistor 28 of still another exemplary embodiment.

In the case illustrated in FIG. 11, four light-emitting elements 22 are provided. The center of gravity of the group of the light-emitting elements 22 can be provided at the center of gravity of the substrate 21.

Similarly to the above description, the pad 21c has a shape extending outward from the light-emitting element 22. The total area of the plurality of pads 21c in plan view can be made larger than the total area of the plurality of light-emitting elements 22.

In addition, the shortest distance L1 between the pad 21c and the pad 21e is made larger than the thickness of the substrate 21. Further, it can be set to "the distance L1 the distance L2 the distance L3."

Others can be the same as those illustrated in FIG. 9.

FIG. 12 is a table for illustrating an example of the first resistor 23, the thermistor 27, and the second resistor 28.

The resistance value of the thermistor 27 is a resistance value at room temperature (25° C.). The total resistance value is a sum of the combined resistance value of the plurality of thermistors 27 connected in parallel, the combined resistance value of the plurality of second resistors 28 connected in series, and the resistance value of the first resistor 23.

When the vehicle lighting device 1 is a daytime running lamp or the like, the light-emitting color can be white. When the vehicle lighting device 1 is a turn signal lamp or the like, the light-emitting color can be umber. When the vehicle lighting device 1 is a stop lamp or the like, the light-emitting color can be red.

When the light-emitting color is white, the luminous flux needs to be 350 lm (lumens). Therefore, as illustrated in FIG. 12, the rated current is set to 350 mA. In addition, two thermistors 27 are connected in parallel. The combined resistance value of the three second resistors 28 is set to 7.75Ω and the resistance value of the first resistor 23 is set to 1.8Ω. Then, the current (rated current) during stabilization becomes 350 mA, and the target luminous flux can be obtained. The size of the thermistor 27 is set to 2012. The current flowing per one thermistor 27 is set to 250 mA or less, and the number of thermistors 27 is set to two. The resistance ratio of the thermistor 27 (the combined resistance value/total resistance value of the thermistor 27 at room temperature (25° C.)) becomes 19.7%. The resistance ratio of the first resistor 23 (the resistance value of the first resistor 23/the total resistance value) becomes 15.1%.

When the light-emitting color is umber, the luminous flux needs to be 250 lm (lumens). Therefore, as illustrated in FIG. 12, the rated current is set to 450 mA. The umber is used for a turn signal lamp or the like, the lighting state is flickering. The size of the thermistor 27 is set to 2012. The current flowing per one thermistor 27 is set to 250 mA or less, and the number of thermistors 27 is set to three. The resistance ratio of the thermistor 27 becomes 18.1%. The resistance ratio of the first resistor 23 becomes 12.7%.

When the light-emitting color is red, the luminous flux needs to be 120 lm (lumens). Therefore, as illustrated in FIG. 12, the rated current is set to 200 mA. The size of the thermistor 27 is set to 2012. The current flowing per one thermistor 27 is set to 250 mA or less, and the number of thermistor 27 is set to one. The resistance ratio of the thermistor 27 becomes 22%. The resistance ratio of the first resistor 23 becomes 15.4%.

As illustrated in FIG. 12, if the resistance value and the current value of the thermistor 27 are within a predetermined range, it is possible to prevent the current fluctuation and fluctuation of the luminous flux due to the resistance value fluctuation in the normal operation region.

In this case, when the resistance ratio of the thermistor 27 increases, the voltage at which the resistance value of the thermistor 27 starts to increase decreases. For example, the position of the peak in FIG. 3 moves to the left. Therefore, the current value of the light-emitting element 22 may decrease at a voltage lower than the upper limit of the rated voltage.

On the other hand, when the resistance ratio of the thermistor 27 decreases, the junction temperature Tj of the light-emitting element 22 increases. For example, A in FIG. 4 moves upward. Therefore, for example, the junction temperature Tj may exceed the maximum value even when the ambient temperature is 55° C. or less.

According to the knowledge obtained by the present inventors, it is preferable that the resistance ratio of the thermistor 27 is 15% or more and 25% or less. In this way, it is possible to start increasing the resistance value of the thermistor 27 in the vicinity of the upper limit of the rated voltage.

The resistance ratio of the first resistor 23 is preferably 10% or more and 20% or less. In this way, even when the voltage applied to the vehicle lighting device 1 fluctuates, it is possible to prevent variations in the brightness of the light emitted from the vehicle lighting device 1.

Vehicle Lamp

The vehicle lamp 100 will be described below.

Hereinafter, a case will be described as an example in which the vehicle lamp 100 is a front combination light provided in a vehicle. However, the vehicle lamp 100 is not limited to the front combination light provided in the vehicle. The vehicle lamp 100 may be a vehicle lamp which is provided in a vehicle, a railway vehicle, or the like.

Figure 13:
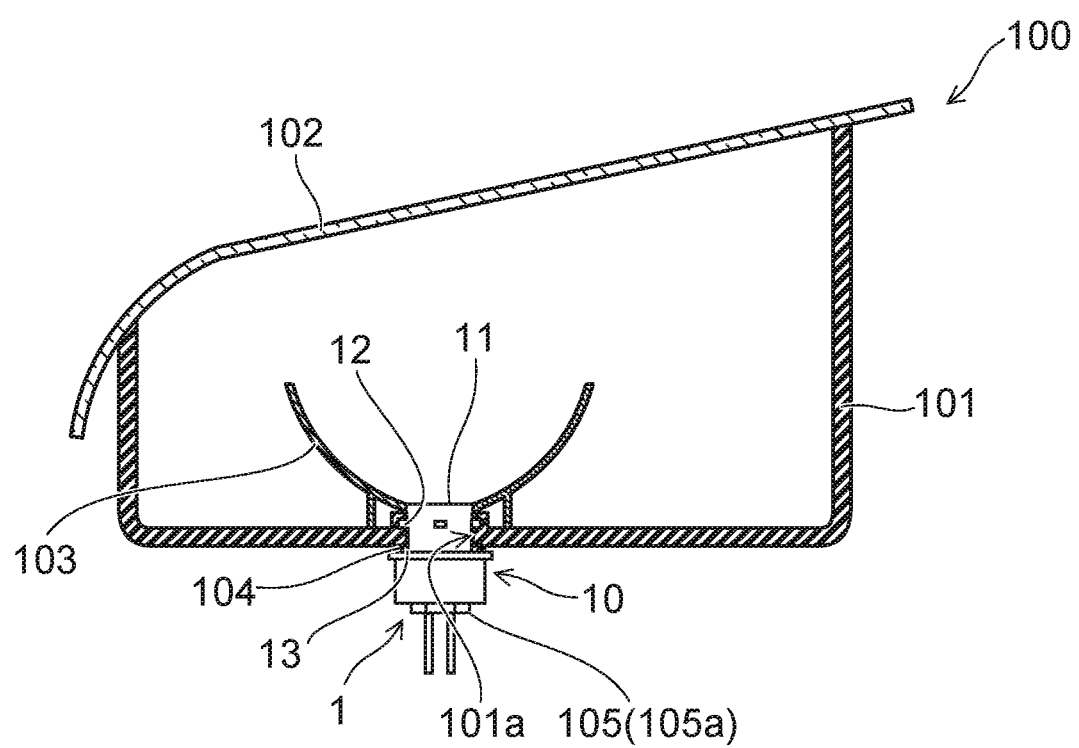
FIG. 13 is a partial sectional view schematically illustrating a vehicle lamp.

FIG. 13 is a partial sectional view illustrating schematically the vehicle lamp 100.

As illustrated in FIG. 13, the vehicle lamp 100 includes the vehicle lighting device 1, a housing 101, a cover 102, an optical element portion 103, a sealing member 104, and the connector 105.

The vehicle lighting device 1 is attached to the housing 101. The housing 101 holds the mounting portion 11. The housing 101 is formed in a box shape of which one end side is open. The housing 101 can be formed of a resin through which light is not transmitted, for example. The housing 101 includes, on the bottom, an attaching hole 101a into which a portion provided with the bayonet 12 of the mounting portion 11 is inserted. A recessed portion into which the bayonet 12 provided in the mounting portion 11 is inserted is provided at the peripheral edge of the attaching hole 101a. A case in which the attaching hole 101a is directly provided in the housing 101 is exemplified; however, an attaching member including the attaching hole 101a may be provided in the housing 101.

The vehicle lighting device 1 is attached to the vehicle lamp 100 in such a manner that the portion provided with the bayonet 12 of the mounting portion 11 is inserted into the attaching hole 101a to rotate the vehicle lighting device 1. Then, the bayonet 12 is held in the recessed portion provided at the peripheral edge of the attaching hole 101a. Such an attaching method is referred to as twist-lock.

The cover 102 is provided so as to block an opening of the housing 101. The cover 102 can be formed of a light-transmitting resin, or the like. The cover 102 may have a function of a lens, for example.

Light emitted from the vehicle lighting device 1 is incident on the optical element portion 103. The optical element portion 103 performs reflection, diffusion, light guiding, condensing, or a formation of a predetermined light distributing pattern of light emitted from the vehicle lighting device 1.

For example, the optical element portion 103 illustrated in FIG. 13 is a reflector. In this case, the optical element portion 103 reflects the light emitted from the vehicle lighting device 1, and forms a predetermined light distributing pattern.

The sealing member 104 is provided between the flange 13 and the housing 101, The sealing member 104 may have an annular shape. The sealing member 104 can be formed of a material with elasticity such as rubber or a silicone resin.

When the vehicle lighting device 1 is attached to the vehicle lamp 100, the sealing member 104 is interposed between the flange 13 and the housing 101. For this reason, an inner space of the housing 101 is sealed by the sealing member 104. In addition, the bayonet 12 is pushed against the housing 101 due to an elastic force of the sealing member 104. Accordingly, it is possible to prevent the vehicle lighting device 1 from being detached from the housing 101.

The connector 105 is fitted to ends of the plurality of power-supply terminals 31 which are exposed to the inside of the hole 10b. A power supply (not illustrated) and the like are electrically connected to the connector 105. For this reason, the power supply (not illustrated) and the light-emitting element 22 are electrically connected when the connector 105 is fitted to the end of the power-supply terminal 31.

In addition, the connector 105 has a stepped portion. Then, a sealing member 105a is attached to the stepped portion. The sealing member 105a is provided to prevent water from entering the inside of the hole 10b. When the connector 105 including the sealing member 105a is inserted into the hole 10b, the hole 10b is sealed so as to be watertight.

The sealing member 105a may have an annular shape. The sealing member 105a can be formed of a material with elasticity such as rubber or a silicone resin. The connector 105 can also be joined to an element on the side of the socket 10 using an adhesive or the like, for example.

While certain embodiments have been described, these embodiments have been presented by way of example only, and are not intended to limit the scope of the inventions, Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A vehicle lighting device comprising:
a socket; and
a light-emitting module that is provided on one end side of the socket,
the light-emitting module including
a substrate having a wiring pattern;
a plurality of light-emitting elements that are electrically connected to the wiring pattern and are connected in series to each other; and
a plurality of thermistors that are electrically connected to the wiring pattern and are connected in parallel to each other, and
the plurality of thermistors connected in parallel to each other being connected in series with the plurality of light-emitting elements connected in series to each other,
the plurality of light-emitting elements being provided in a central region of the substrate,
the plurality of thermistor being provided in a peripheral edge region of the substrate, and
a center of gravity of each of the plurality of the thermistors being provided on a circumference or around the circumference centered on a center of gravity of a group of the light-emitting elements.

2. The device according to claim 1, wherein
the center of gravity of the group of the light-emitting elements is provided at a center of the substrate.

3. The device according to claim 1, wherein
the center of gravity of each of the plurality of thermistors is provided within a range of ±2 mm from the circumference centered on the center of gravity of the group of the light-emitting elements.

4. A vehicle lamp comprising:
the vehicle lighting device according to claim 1; and
a housing to which the vehicle lighting device is attached.

5. The device according to claim 1, wherein
each of the plurality of light-emitting elements is electrically connected to a first pad of the wiring pattern,
each of the plurality of thermistors is electrically connected to a second pad of the wiring pattern, and
a shortest distance between the first pad and the second pad is larger than a thickness of the substrate.

6. The device according to claim 1, wherein
the light-emitting module further includes a plurality of resistors that are electrically connected to the wiring pattern and are connected in series to each other,
the plurality of resistors connected in series are connected in series with the plurality of thermistors connected in parallel to each other and the plurality of light-emitting elements connected in series to each other,
the plurality of resistors are divided into two groups with the plurality of thermistors interposed therebetween, and
a center of gravity of each of the plurality of resistors is provided on a circumference or around the circumference centered on a center of gravity of a group of the thermistors.

7. The device according to claim 1, wherein
the light-emitting module further includes a plurality of resistors that are electrically connected to the wiring pattern and are connected in series to each other,
the plurality of resistors connected in series are connected in series with the plurality of thermistors connected in parallel to each other and the plurality of light-emitting elements connected in series to each other,
the plurality of resistors are divided into two groups with the plurality of thermistors interposed therebetween, and
a center of gravity of each of the plurality of resistors is provided on a circumference or around the circumference centered on a center of gravity of a group of the thermistors.

8. A vehicle lighting device comprising:
a socket; and
a light-emitting module that is provided on one end side of the socket,
the light-emitting module including
a substrate having a wiring pattern;
a plurality of light-emitting elements that are electrically connected to the wiring pattern and are connected in series to each other; and
a plurality of thermistors that are electrically connected to the wiring pattern and are connected in parallel to each other, and
the plurality of thermistors connected in parallel to each other being connected in series with the plurality of light-emitting elements connected in series to each other,
each of the plurality of light-emitting elements being electrically connected to a first pad of the wiring pattern,
each of the plurality of thermistors being electrically connected to a second pad of the wiring pattern, and
a shortest distance between the first pad and the second pad being larger than a thickness of the substrate.

9. The device according to claim 8, wherein
the first pad has a shape extending outward of the light-emitting element connected to the first pad.

10. The device according to claim 8, wherein
the second pad has a shape extending outward of the thermistor connected to the second pad.

11. A vehicle lamp comprising:
the vehicle lighting device according to claim 8; and
a housing to which the vehicle lighting device is attached.

12. A vehicle light device comprising:
a socket; and
a light-emitting module that is provided on one end side of the socket,
the light-emitting module including
a substrate having a wiring pattern;
a plurality of light-emitting elements that are electrically connected to the wiring pattern and are connected in series to each other; and
a plurality of thermistors that are electrically connected to the wiring pattern and are connected in parallel to each other, and
the plurality of thermistors connected in parallel to each other being connected in series with the plurality of light-emitting elements connected in series to each other,
the light-emitting module further including a plurality of resistors that being electrically connected to the wiring pattern and being connected in series to each other,
the plurality of resistors connected in series being connected in series with the plurality of thermistors connected in parallel to each other and the plurality of light-emitting elements connected in series to each other,
the plurality of resistors being divided into two groups with the plurality of thermistors interposed therebetween, and
a center of gravity of each of the plurality of resistors is provided on a circumference or around the circumference centered on a center of gravity of a group of the thermistors.

13. The device according to claim 12, wherein
the number of resistors included in one of the groups is the same as the number of resistors included in the other of the groups.

14. The device according to claim 12, wherein:
each of the plurality of light-emitting elements being electrically connected to a first pad of the wiring pattern,
each of the plurality of thermistors being electrically connected to a second pad of the wiring pattern,
each of the plurality of resistors is electrically connected to a third pad of the wiring pattern, and
a shortest distance between the second pad and the third pad is larger than a thickness of the substrate.

15. The device according to claim 14, wherein
the third pad has a shape extending outward of the resistors connected to the third pad.

16. The device according to claim 14, wherein
a shortest distance between the first pad and the second pad is longer than the shortest distance between the second pad and the third pad.

17. The device according to claim 12, wherein
the center of gravity of each of the plurality of resistors is provided within a range of ±2 mm from the circumference centered on the center of gravity of the group of the thermistors.

18. The device according to claim 12, wherein
the plurality of thermistors are positive temperature coefficient thermistors, and
at least one of the plurality of resistors is a film-shaped resistor.

19. The device according to claim 12, wherein
the thermistor has a resistance ratio of 15% or more and 25% or less.

20. A vehicle lamp comprising:
the vehicle lighting device according to claim 12; and
a housing to which the vehicle lighting device is attached.

* * * * *